United States Patent
Onozawa et al.

(10) Patent No.: US 10,297,043 B2
(45) Date of Patent: May 21, 2019

(54) DETECTOR FOR DETECTING POSITION OF IC DEVICE AND METHOD FOR THE SAME

(71) Applicant: ADVANTEST CORPORATION, Tokyo (JP)

(72) Inventors: Masataka Onozawa, Tokyo (JP); Aritomo Kikuchi, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 6 days.

(21) Appl. No.: 15/481,703

(22) Filed: Apr. 7, 2017

(65) Prior Publication Data
US 2018/0294244 A1  Oct. 11, 2018

(51) Int. Cl.
  *G03F 7/20* (2006.01)
  *G06T 7/73* (2017.01)

(52) U.S. Cl.
  CPC ............ *G06T 7/75* (2017.01); *G03F 7/70666* (2013.01); *G06T 7/74* (2017.01); *G06T 2207/30141* (2013.01); *G06T 2207/30148* (2013.01); *G06T 2207/30152* (2013.01); *H01L 2224/131* (2013.01); *H01L 2224/14131* (2013.01)

(58) Field of Classification Search
  CPC ................................ H01L 24/75; G06T 7/73
  USPC ......................................................... 382/103
  See application file for complete search history.

(56) References Cited

U.S. PATENT DOCUMENTS

| | | | | |
|---|---|---|---|---|
| 6,230,394 B1* | 5/2001 | McWilliams | .......... | H05K 13/02 108/50.11 |
| 8,294,759 B2 | 10/2012 | Kikuchi et al. | | |
| 8,797,053 B2* | 8/2014 | Rutigliano | .......... | G01R 1/0735 324/750.03 |
| 8,941,729 B2 | 1/2015 | Kikuchi et al. | | |
| 2005/0151551 A1* | 7/2005 | Okuda | .......... | G01R 31/01 324/750.19 |
| 2007/0069752 A1* | 3/2007 | Ito | .......... | G01R 31/2887 324/750.23 |
| 2013/0169303 A1 | 7/2013 | Yamashita | | |
| 2014/0111235 A1* | 4/2014 | Kikuchi | .......... | G01R 31/2893 324/750.23 |

FOREIGN PATENT DOCUMENTS

WO  2004/106945 A1  12/2004

* cited by examiner

*Primary Examiner* — Justin P. Misleh
(74) *Attorney, Agent, or Firm* — Greenblum & Bernstein, P.L.C.

(57) ABSTRACT

An apparatus for detecting an attitude of electronic components. The electronic components include an electronic component having a plurality of terminals. The apparatus includes a storage and an image processor. The image processor is configured to: extract a binarized image from an image acquired by an imaging device; perform image matching between a terminal in the binarized image and a terminal in a model image to extract attitude candidates of image matching; obtain coordinates of a corner part of the plurality of terminals from the binarized image of the electronic component; select an attitude candidate from among the attitude candidates of image matching; and output the attitude candidate as a detected attitude of the electronic component.

2 Claims, 13 Drawing Sheets

DETECTOR FOR DETECTING POSITION OF IC DEVICE AND METHOD FOR THE SAME

BACKGROUND OF THE INVENTION

1. Technical Field of the Invention

The present invention relates to an apparatus and method which are used, such as when testing semiconductor integrated circuit elements or other electronic components using an electronic component testing apparatus including a handling apparatus, and which detect an attitude, such as a two-dimensional position with respect to a specific reference, of electronic components that are objects to be tested.

2. Description of the Related Art

In this type of handling apparatus of an electronic component testing apparatus, there is known a technique of calculating relative misalignment (x, y, θ) of solder bumps with respect to the package outer shape of an electronic component under test (hereinafter, also referred to as a device under test (DUT)) using a camera, such as when transporting the DUT, and correcting positions of the solder bumps to appropriate contact positions (Patent Document 1: WO2004/106945).

SUMMARY OF THE INVENTION

The camera used in the above prior art is disposed at an appropriate position with a certain view angle so as to be able to image the whole of a DUT, but if the same camera is used to image a large DUT, the whole of the large DUT may not be imaged. Recognition of the attitude of a DUT using a camera is performed, such as by a process of image matching between a preliminarily-set model image and an actual image of the DUT acquired by the camera. If only a part of the DUT can be imaged, image matching between the model image and the actual image may occur at a plurality of sites and, unfortunately, the attitude cannot be specified. In this context, the position and view angle of the camera may be adjusted so as to be able to image the whole of a DUT in accordance with the size of the DUT. In this case, however, the camera may have to be moved to an appropriate position or replaced with another camera every time the DUT is changed.

An object of the present invention is therefore to provide an apparatus and method for detecting an attitude of electronic components with which the attitude of a DUT can be recognized even when only a part of the DUT can be imaged.

According to an aspect of the present invention, an apparatus for detecting an attitude of electronic components is provided. The electronic components include a first electronic component and a second electronic component each configured such that a plurality of terminals is regularly arranged in an X-Y plane. The apparatus includes an imaging device fixed to a site at which the imaging device can image a whole of the plurality of terminals of the first electronic component but can image only a part of the plurality of terminals of the second electronic component. The part includes a corner part of the plurality of terminals of the second electronic component. The apparatus further includes a storage and a first to fourth image processors. The storage stores at least a first model image of a part or whole of the plurality of terminals of the first electronic component and a second model image of the part, including the corner part, of the plurality of terminals of the second electronic component. The first image processor extracts a binarized image of the plurality of terminals of the second electronic component from an image acquired by the imaging device. The second image processor performs image matching between each terminal in the binarized image of the second electronic component and each terminal in the second model image and extracts attitude candidates of image matching. The third image processor extracts a coordinate of an endmost part of the plurality of terminals in the X-axis direction and a coordinate of an endmost part of the plurality of terminals in the Y-axis direction from the binarized image of the second electronic component and obtains coordinates of the corner part in the binarized image from the coordinate of the endmost part in the X-axis direction and the coordinate of the endmost part in the Y-axis direction. The fourth image processor selects an attitude candidate from among the attitude candidates and outputs the attitude candidate as a detected attitude of the second electronic component. The attitude candidate is selected such that the coordinates of the corner part in the second model image in the attitude candidate are closest on the X-Y plane to the coordinates of the corner part in the binarized image.

In an embodiment of the present invention, the first image processor may extract a binarized image of the plurality of terminals of the first electronic component from the image acquired by the imaging device, the second image processor may perform image matching between each terminal in the binarized image of the first electronic component and each terminal in the first model image and extract an attitude candidate of the first electronic component of image matching, and the fourth image processor may output the attitude candidate of the first electronic component as a detected attitude of the first electronic component.

In an embodiment of the present invention, for the binarized image of the second electronic component, the third image processor may execute, across the Y-axis direction, a process of accumulating brightness values of the binarized image in the X-axis direction to extract a Y coordinate at which a peak of an accumulated brightness value is located at the endmost part, and execute, across the X-axis direction, a process of accumulating brightness values of the binarized image in the Y-axis direction to extract an X coordinate at which a peak of an accumulated brightness value is located at the endmost part.

In an embodiment of the present invention, the first electronic component and the second electronic component may each be a ball grid array type IC chip and the terminals may be ball terminals.

According to another aspect of the present invention, a method for detecting an attitude of electronic components is provided. The electronic components include a first electronic component and a second electronic component each configured such that a plurality of terminals is regularly arranged in an X-Y plane. The method includes preparing an imaging device fixed to a site at which the imaging device can image a whole of the plurality of terminals of the first electronic component but can image only a part of the plurality of terminals of the second electronic component. The part includes a corner part of the plurality of terminals of the second electronic component. The method further includes storing at least a first model image of a part or whole of the plurality of terminals of the first electronic component and a second model image of the part, including the corner part, of the plurality of terminals of the second electronic component; extracting a binarized image of the plurality of terminals of the second electronic component from an image acquired by the imaging device; performing image matching between each terminal in the binarized image of the second electronic component and each terminal in the second model image and extracting attitude candidates of image matching; extracting a coordinate of an endmost part of the plurality of terminals in the X-axis direction and a coordinate of an endmost part of the plurality of terminals in the Y-axis direction from the binarized image of the second electronic component and obtaining coordinates of the corner part in the binarized image from the coordinate of the endmost part in the X-axis direction and the coordinate of the endmost part in the Y-axis direction; and selecting an attitude candidate from among the attitude candidates and outputting the attitude candidate as a detected attitude of the second electronic component. The attitude candidate is selected such that the coordinates of the corner part in the second model image in the attitude candidate are closest on the X-Y plane to the coordinates of the corner part in the binarized image.

In the present invention, for the second electronic component of which only a part including the corner part of the plurality of terminals can be imaged, the binarized image of the second electronic component is used to extract the coordinate of an endmost part of the plurality of terminals in the X-axis direction and the coordinate of an endmost part of the plurality of terminals in the Y-axis direction, and the coordinates of the corner part in the binarized image is obtained from the coordinate of the endmost part in the X-axis direction and the coordinate of the endmost part in the Y-axis direction. Then, an attitude candidate is selected from among the attitude candidates of image matching with the second model image and output as a detected attitude of the second electronic component. The attitude candidate is selected such that the coordinates of the corner part in the second model image in the attitude candidate are closest on the X-Y plane to the coordinates of the corner part in the binarized image. Through this operation, the attitude of a DUT can be accurately recognized even when only a part of the DUT can be imaged.

DESCRIPTION OF THE PREFERRED EMBODIMENT

Figure 1:
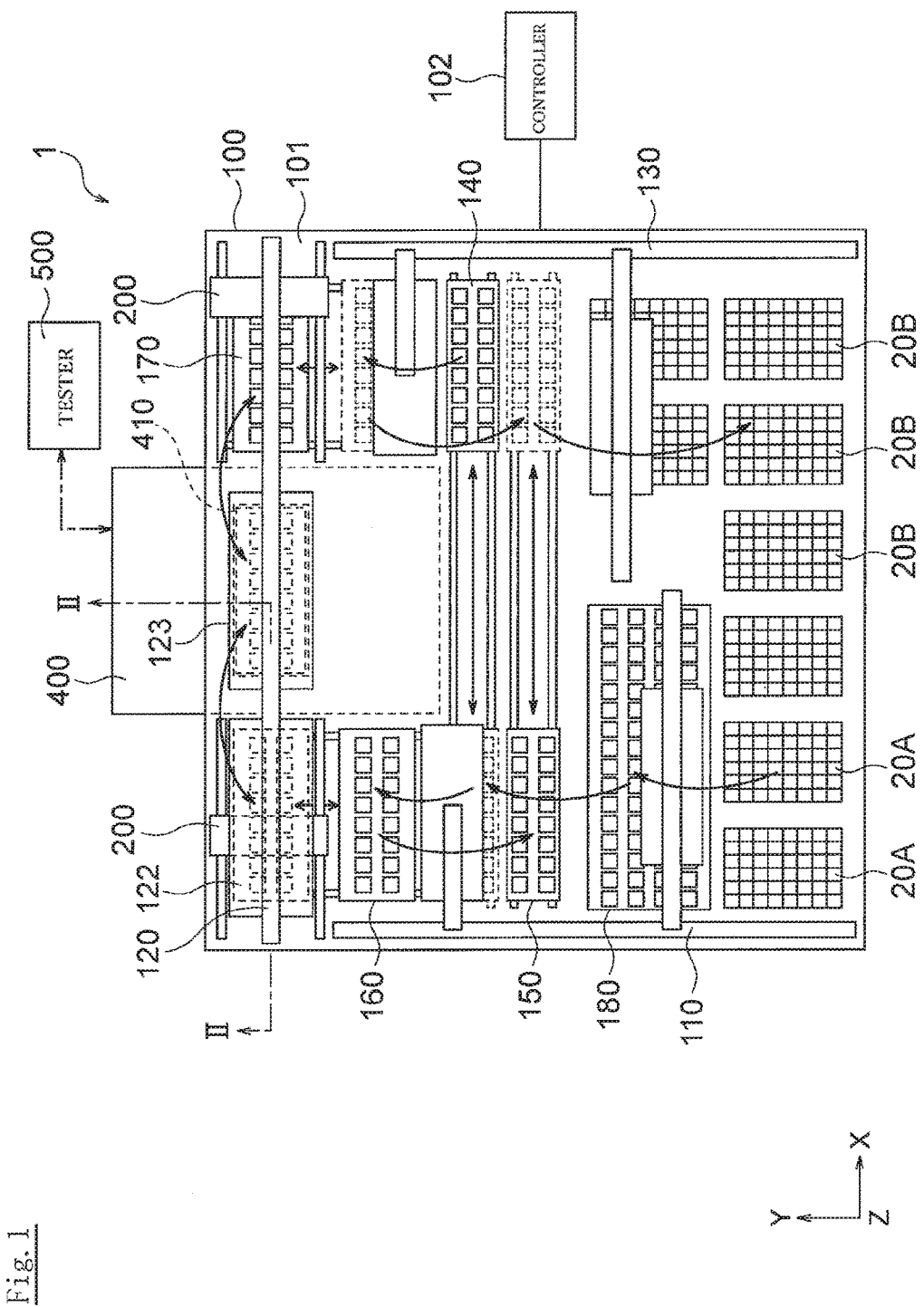
FIG. 1 is a plan view illustrating an example of an electronic component testing apparatus to which the apparatus and method for detecting an attitude of electronic components according to the present invention are applied.
Figure 2:
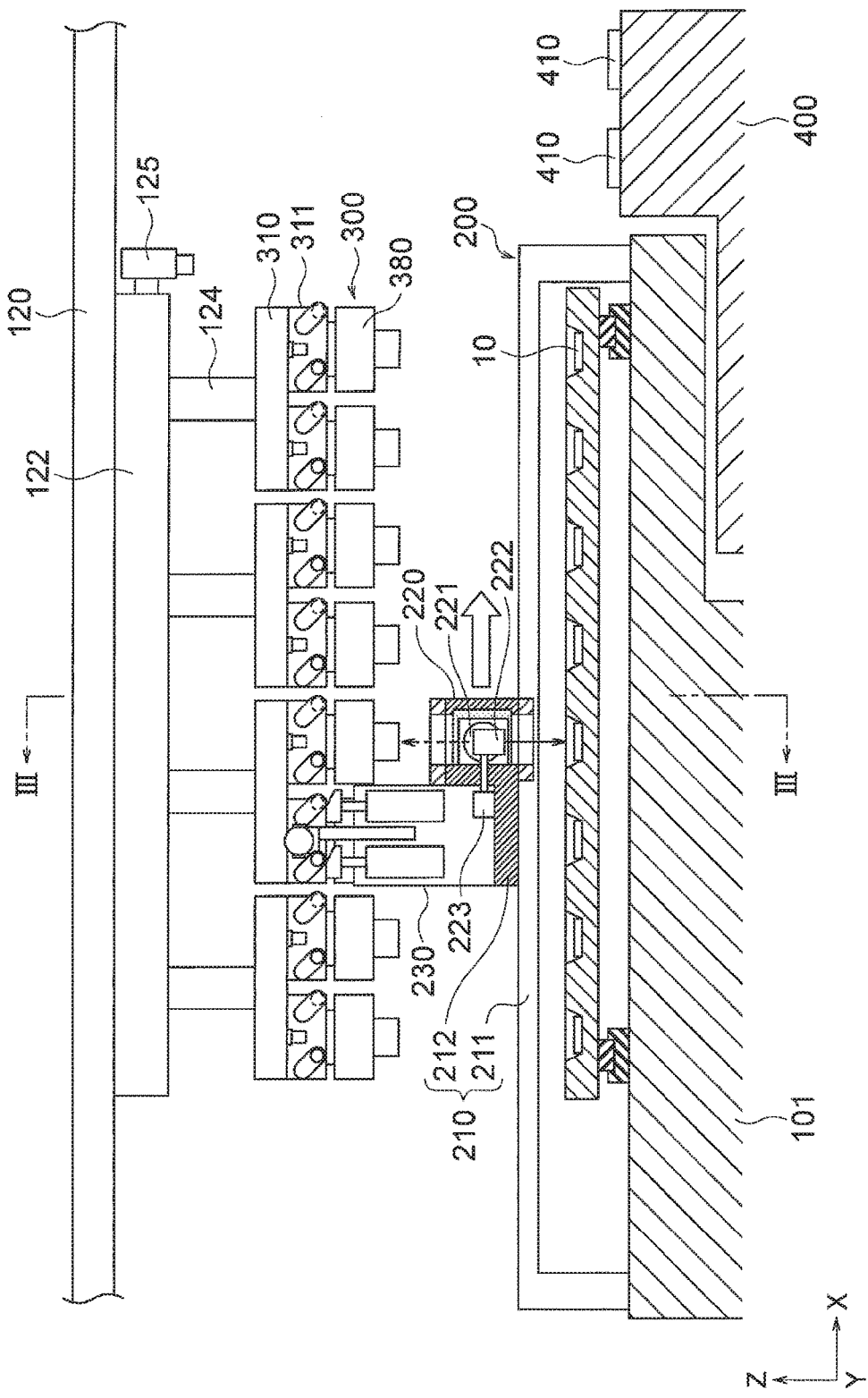
FIG. 2 is a cross-sectional view along line II-II of FIG. 1.
Figure 3:
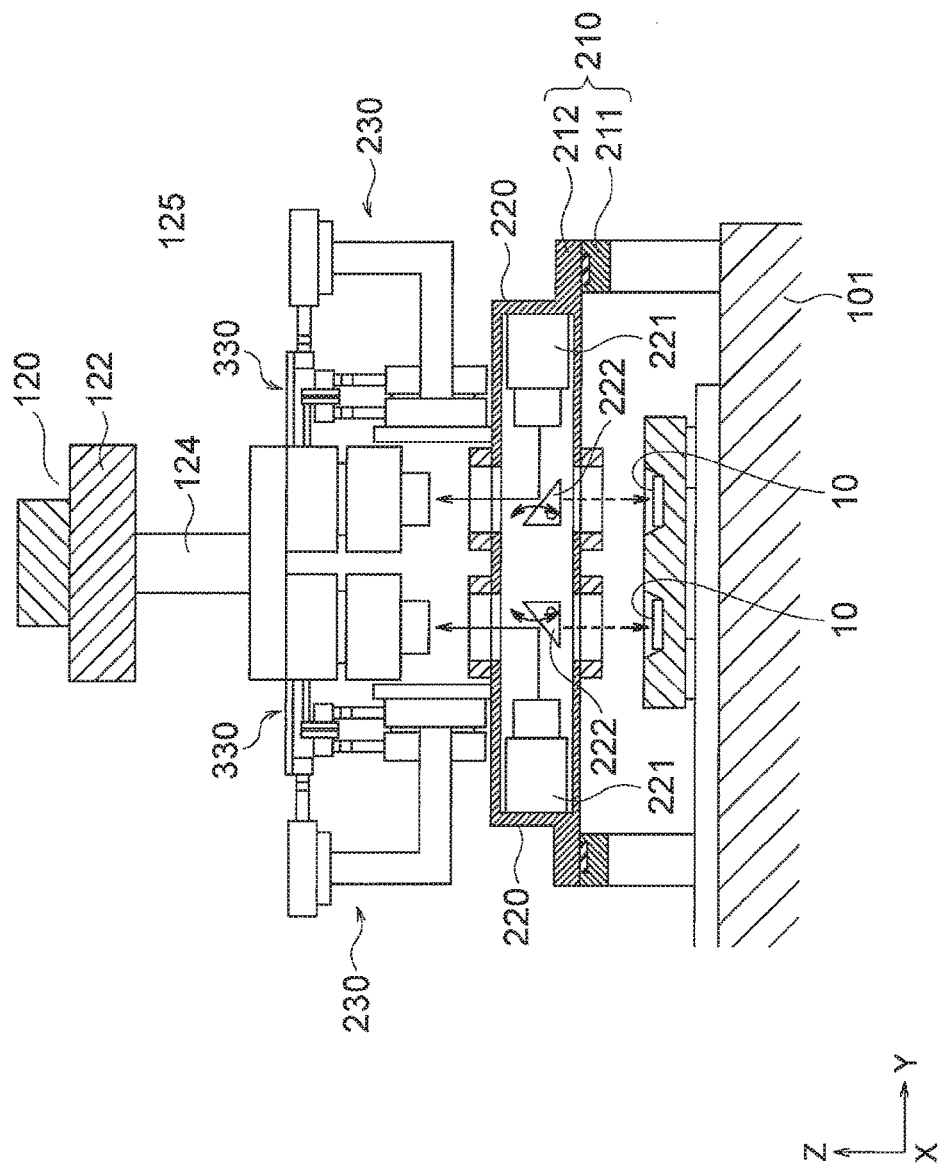
FIG. 3 is a cross-sectional view along line III-III of FIG. 2.

An Example of an Electronic Component Testing Apparatus to Which the Present Invention is Applied First, an example of an electronic component testing apparatus 1 to which the apparatus and method for detecting an attitude of electronic components according to the present invention are applied will be reviewed with reference to FIG. 1 (plan view), FIG. 2 (cross-sectional view along line II-II), and FIG. 3 (cross-sectional view along line III-III). With regard to the detailed configuration of the electronic component testing apparatus 1 and its action and effect, the contents of Japanese Patent Application No. 2012-234440 (published as JP2014-85230A) filed on Oct. 24, 2012 and U.S. patent application Ser. No. 14/058,876 (published as US2014/0111235A1) filed on Oct. 21, 2013 are incorporated herein by reference. Note, however, that the apparatus and method for detecting an attitude of electronic components according to the present invention are not limited to being applied to the electronic component testing apparatus 1, which will be described below, and can also be applied to other electronic component testing apparatuses.

As illustrated in FIG. 1, the electronic component testing apparatus 1 in the present embodiment includes a handler 100, a test head 400, and a tester 500, and is an apparatus that performs positioning of a DUT 10 (alignment between terminals of the DUT 10 and terminals of a socket 410, here and hereinafter) using the apparatus and method for detecting an attitude of electronic components according to the present invention and then tests the DUT 10.

The test head 400 is inserted into a space formed below a base plate 101 of the handler 100, and a socket 410 of the test head 400 faces the inside of the handler 100 through an opening formed in the base plate 101. The test head 400 is electrically connected to the tester 500.

In the electronic component testing apparatus 1, the handler 100 transports the DUT 10 before the test from a customer tray 20A to the test head 400 and brings terminals of the DUT 10 into contact with contact pins of the socket 410 of the test head 400 using a contact arm 300 (see FIG. 2 and FIG. 3). Then, after the test head 400 and the tester 500 test the DUT 10, the handler 100 places the tested DUT 10 on a customer tray 20B while sorting the tested DUT 10 according to the test result.

The handler 100 includes three transport devices 110 to 130, two X-direction buffers 140 and 150, two Y-direction buffers 160 and 170, a heat plate 180, and two alignment devices 200 and 200. Control of each configuration of the handler 100 described below is executed by a controller 102 of the handler 100, and the controller 102 is configured to exchange information also with the test head 400 and the tester 500.

The first transport device 110 takes up the DUT 10 before the test from the customer tray 20A and moves it to the heat plate 180 in order to execute a test under a high-temperature condition. The surface of the heat plate 180 is formed with a plurality of recesses. When the DUT 10 is placed in a recess by the first transport device 110, the DUT 10 is heated by the heat plate 180 to a predetermined test temperature. After the DUT 10 is heated, the first transport device 110 moves the DUT 10 from the heat plate 180 to the first X-direction buffer 140.

The second transport device 120 includes two movable heads 122 and 123. Accordingly, while one movable head 122 (or 123) is doing alignment, the other movable head 123 (or 122) brings the DUT 10 into contact with the socket 410. FIG. 1 illustrates a state in which the first movable head 122 is positioned at the left side and the second movable head 123 is positioned at the middle (above the socket 410).

When the DUT 10 is placed by the first transport device 110, the first Y-direction buffer 160 moves the moving plate 162 into the operating range of the first movable head 122 of the second transport device 120. The alignment device 200 is provided in an overlapping portion between the operating range of the first Y-direction buffer 160 and the operating range of the first movable head 122. The first movable head 122 takes up the DUT 10 from the first Y-direction buffer 160 while positioning the DUT 10 using the alignment device 200.

As illustrated in FIG. 2, each of the first movable head 122 and the second movable head 123 includes 16 contact arms 300 arrayed in 2 rows by 8 columns and holds 16 DUTs 10 simultaneously. The first movable head 122 and the second movable head 123 are each provided with a first camera 125 for imaging the socket 410 of the test head 400.

The first movable head 122 moves the DUT 10 to above the socket 410 of the test head 400 and then lowers each contact arm 300 to bring terminals of the DUT 10 into electrical contact with contact pins of the socket 410. In this state, the test head 400 and the tester 500 test the DUT 10 by inputting and outputting a test signal with respect to the DUT 10.

After the test of the DUT 10 is completed, the first movable head 122 returns the DUT 10 to the first Y-direction buffer 160. Then, the tested DUT 10 is moved into the operating range of the first transport device 110 by the first Y-direction buffer 160 and transshipped from the first Y-direction buffer 160 to the second X-direction buffer 150 by the first transport device 110. Then, the tested DUT 10 is transported into the operating range of the third transport device 130 by the second X-direction buffer 150.

On the other hand, when feeding the DUT 10 to the second movable head 123 on the right side in FIG. 1, the first X-direction buffer 140 moves into the operating range of the third transport device 130, which transships the DUT 10 from the first X-direction buffer 140 to the second Y-direction buffer 170. When the DUT 10 is placed in the second Y-direction buffer 170 by the third transport device 130, the second Y-direction buffer 170 moves into the operating range of the second transport device 120.

Another alignment device 200 is provided in an overlapping portion between the operating range of the second Y-direction buffer 170 and the operating range of the second movable head 123. The second movable head 123 takes up the DUT 10 from the second Y-direction buffer 170 while positioning the DUT 10 using that alignment device 200. Then, the second movable head 123 moves the DUT 10 to above the socket 410 and thereafter lowers the contact arm 300 to bring terminals of the DUT 10 into electrical contact with contact pins of the socket 410. In this state, the test head 400 and the tester 500 test the DUT 10 by inputting and outputting a test signal with respect to the DUT 10.

After the test of the DUT 10 is completed, the second movable head 123 returns the DUT 10 to the second Y-direction buffer 170. Then, the tested DUT 10 is moved into the operating range of the third transport device 130 by the second Y-direction buffer 170 and transshipped from the second Y-direction buffer 170 to the second X-direction buffer 150 by the third transport device 130.

The third transport device 130 includes 16 suction heads that can each adsorb and hold the DUT 10, and transships the tested DUT 10 from the second X-direction buffer 150 to the customer tray 20B. At this time, the handler 100 has acquired information about the test result of each DUT 10 from the tester 500, and a sorting arm 132 moves the DUT 10 to any of the customer trays 20B, 20B and 20B which corresponds to the test result of each of the 16 suctioned DUTs. This allows sorting of DUTs 10 into a plurality of customer trays 20B in accordance with the test results.

These two alignment devices 200 and 200 are provided in the operating range of the first movable head 122 and the operating range of the second movable head 123, respectively. The configuration of the alignment device 200 provided within the operating range of the first movable head 122 will be described below, but the alignment device 200 provided within the operating range of the second movable head 123 also has the same configuration.

The alignment device 200 is a device used for the positioning of the DUT 10. As illustrated in FIG. 2 and FIG. 3, the alignment device 200 includes a moving unit 210, an imaging unit 220, and an operation unit 230. The configuration including the imaging unit 220 corresponds to the apparatus for detecting an attitude of electronic components according to the present invention.

The moving unit 210 includes X-direction rails 211 and a slide portion 212. A pair of X-direction rails 211 is extended in the X direction so as to be positioned at the right and left sides of the moving plate 162 of the first Y-direction buffer 160 located within the operating range of the first movable head 122.

The slide portion 212 slides on the X-direction rails 211 along the X direction by a motor and a belt mechanism which are not illustrated. The imaging unit 220 and the operation unit 230 are incorporated in the slide portion 212 and move in the X direction together with the slide portion 212.

The imaging unit 220 includes a second camera 221, a mirror 222, an air cylinder 223, and a light 224. The second camera 221 is, for example, an imaging device having a CCD device, a lens, and the like, and is laterally placed at the slide portion 212. The mirror 222 is disposed on the optical axis of the second camera 221. The mirror 222 is fixed to the driving shaft of the air cylinder 223, which is driven thereby to rotate the mirror 222 by 90° around the driving shaft. This allows the optical axis of the second camera 221 to be switched upward or downward. According to the switching of the direction of the optical axis by the mirror 222, the second camera 221 can image the DUT 10 placed on the moving plate 162 of the first Y-direction buffer 160 or image a holding unit 380 of the contact arm 300. When only one main surface of the DUT 10 is imaged as will be described later, the mirror 222 may be fixed.

As illustrated in FIG. 2 and FIG. 3, the contact arm 300 includes a base part 310, a housing 311 (which accommodates a floating unit, an adjustment unit 330 and a lock and free unit), and the holding part 380. The lock and free unit is a mechanism that locks or unlocks a floating function of the floating unit. The base part 310 of the contact arm 300 is connected to the first movable head 122 through a Z-direction actuator 124. The lower side of the base part 310 and the housing 311 are fixed to each other, while a ball bearing is interposed between the housing 311 and the holding unit 380, so that the holding unit 380 is capable of relative planar motion and rotation in the X-Y plane with respect to the base part 310 to which the housing 311 is fixed.

The operation unit 230 of the above-described alignment device 200 is a unit that operates the adjustment unit 330 of the contact arm 300. The operation unit 230 includes three operation portions that can independently operate three respective adjustment portions of the adjustment unit 330. These three operation portions operate the three adjustment portions thereby to operate the adjustment unit 330 of the adjustment unit 330, which horizontally moves and rotates the floating unit on the X-Y plane. Consequently, the DUT 10 suctioned by the holding unit 380 can be aligned with the socket 410 while being suctioned.

More specifically, the Z-direction actuator 124 is extended to lower the contact arm 300 so that the contact arm 300 adsorbs and holds the DUT 10 placed on the moving plate 162 of the first Y-direction buffer 160. Once the DUT 10 is adsorbed and held, the Z-direction actuator 124 is shortened to raise the contact arm 300. Then, the lock and free unit is unlocked to make the holding part 380 not restrained with respect to the base unit 310. The second camera 221 of the imaging unit 220 is then used to image the DUT 10 held by the holding unit 380 while moving the slide portion 212 of the alignment device 200 along the X direction as illustrated in FIG. 2.

Then, image processing is performed on the image information captured by the camera 221 to recognize terminals of the DUT 10. Then, the amount of driving of the operation unit 230 is calculated on the basis of the positions of the terminals and the preliminarily-recognized positions of contact pins of the socket 410, and an instruction regarding the amount of driving is given to the operation unit 230. The operation unit 230 operates the adjustment unit 330 in response to the instruction. Then, the lock and free unit locks the floating unit. Thus, the relative alignment of the DUT 10 with respect to the socket 410 is completed. Then, after the first movable head 122 moves to above the socket 410 of the test head 400, the Z-direction actuator 124 is extended to lower the first movable head 122 so that the DUT 10 is pressed against the socket 410. This operation brings terminals of the DUT 10 into contact with respective contact pins of the socket 410. Under this state, the test head 400 and the tester 500 test the DUT 10 by inputting/outputting a test signal with respect to the DUT 10. After the test of the DUT 10 is completed, the Z-direction actuator 124 is shortened to raise the contact arm 300, and the first movable head 122 moves the DUT 10 to the first Y-direction buffer 160.

Detection of an Attitude of Electronic Components

Next, detection of an attitude of the DUT 10 using the second camera 221 of the alignment device 200 will be described. As used hereinafter, the attitude of a DUT 10 is defined by coordinate difference components ($\Delta x$, $\Delta y$, $\Delta \theta$) of the DUT 10 with respect to known coordinates of a model image as a reference image, that is, coordinates ($x_0$, $y_0$, $\theta_0$) in the X-Y plane. In one or more embodiments of the present invention, the attitude of a DUT 10 may be detected as absolute coordinates ($x_1$, $y_1$, $\theta_1$) in the same coordinate system as that of the coordinates of the model image. Control described below is executed by the controller 102 of the handler 100.

Figure 4A:
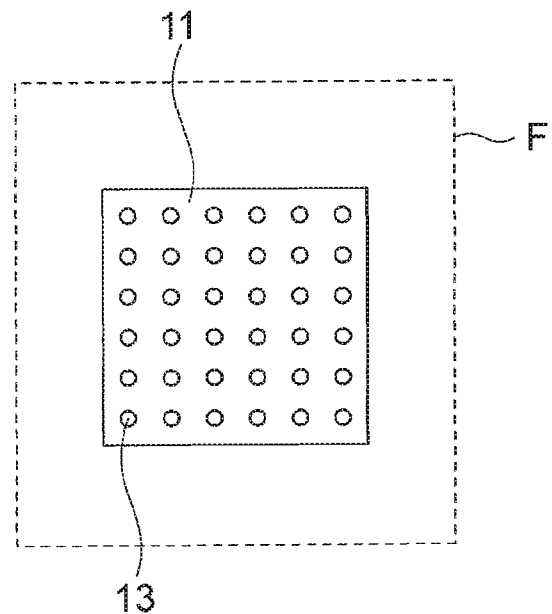
FIG. 4A is a plan view illustrating an example of a first electronic component that is an object to be detected by the apparatus and method for detecting an attitude of electronic components according to the present invention.
Figure 4B:
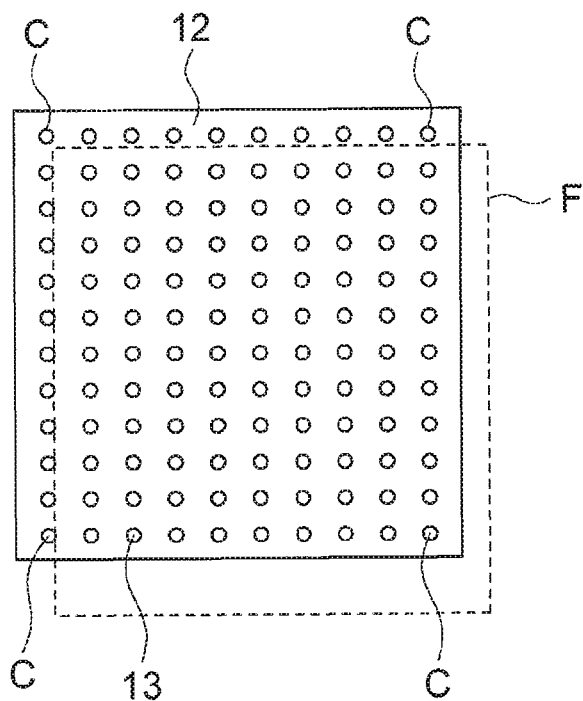
FIG. 4B is a plan view illustrating an example of a second electronic component that is an object to be detected by the apparatus and method for detecting an attitude of electronic components according to the present invention.
Figure 8A:
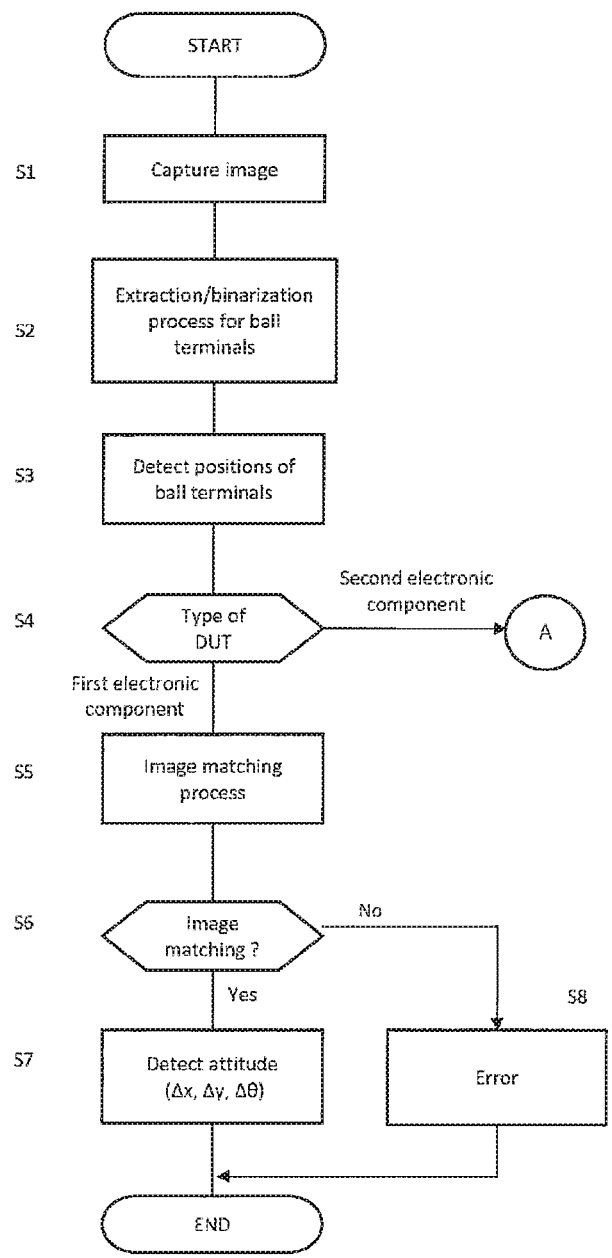
FIG. 8A is a flowchart (part 1) illustrating an example of a process of the apparatus and method for detecting an attitude according to the present invention.

FIG. 4A is a plan view illustrating an example of an electronic component as the DUT 10, that is, a view of a ball grid array type IC chip when viewed from the side of a main surface on which ball terminals (solder bumps) are provided. More specifically, FIG. 4A represents a view when the IC chip suctioned by the holding unit 380 of the contact arm 300 illustrated in FIG. 1 to FIG. 3 is imaged by the second camera 221 from below. The relatively small electronic component illustrated in FIG. 4A is referred also to as a first electronic component 11 while the relatively large electronic component illustrated in FIG. 4B is referred also to as a second electronic component 12. In general, ball terminals 13 of a ball grid array type IC chip are regularly arranged in a matrix form, as illustrated in FIG. 4A, but in another type of ball grid array IC chip, they may be arranged in a staggered form. The dotted frame F of FIG. 4A represents an imaging range by the second camera 221. For the first electronic component 11, the view angle of the second camera 221 is taken into account to set its fixing position such that all the ball terminals 13 fall within the imaging range of the second camera 221. FIG. 8A is a flowchart illustrating an attitude detection process for the first electronic component 11 using the second camera 221 of the alignment device 200.

Figure 5A:
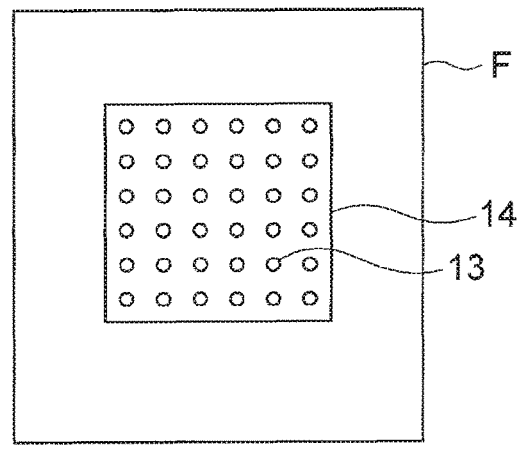
FIG. 5A illustrates an example of an image (captured raw image) for describing a method for detecting an attitude of the first electronic component illustrated in FIG. 4A.
Figure 5B:
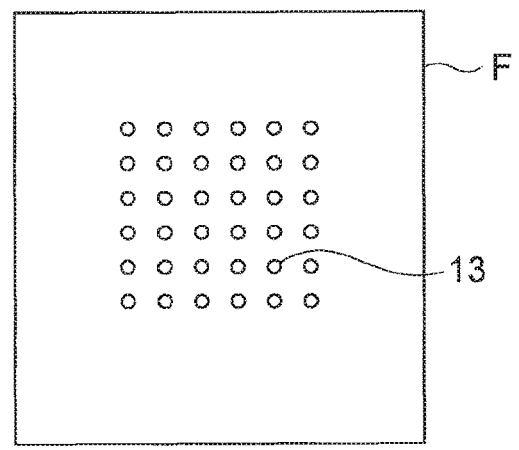
FIG. 5B illustrates an example of an image (image after a binarization process) for describing the method for detecting an attitude of the first electronic component illustrated in FIG. 4A.

As illustrated in step S1 of FIG. 8A, the second camera 221 is first used to image the DUT 10 suctioned by the holding unit 380 of the contact arm 300. FIG. 5A illustrates an example of an image captured by the second camera 221. The raw image captured by the second camera 221 is, for example, a 256-gradation image. Although not illustrated in detail, this raw image reflects not only the ball terminals 13 but also an outer shape 14 of the IC package and the lower surface of the holding unit 380 of the contact arm 300 which adsorbs and holds the DUT 10. To extract only an image of the ball terminals 13 from among them, as illustrated in step S2 of FIG. 8A, the raw image of FIG. 5A undergoes a black-and-white binarizing process and an area filtering process that extracts only an image corresponding to the area of one ball terminal. The area filtering process as performed herein is to set the area of one ball terminal as a threshold and remove binarized images of which the area is larger than or smaller than the threshold. Through this operation, as illustrated in FIG. 5B, a binarized image only of the ball terminals 13 is obtained from which unnecessary images are removed, such as an outer shape 14 of the IC package and the lower surface of the holding unit 380 of the contact arm 300 which adsorbs and holds the DUT 10.

Figure 5C:
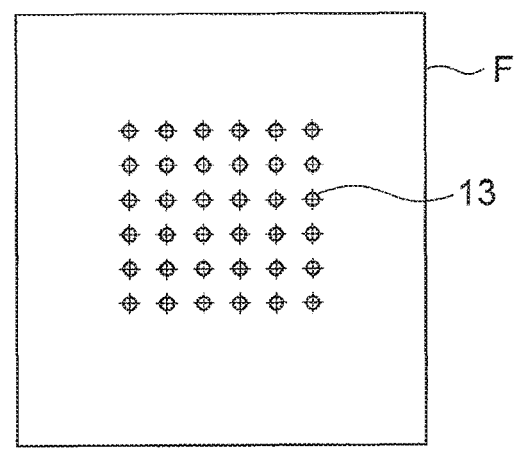
FIG. 5C illustrates an example of an image (image after a barycentric position process) for describing the method for detecting an attitude of the first electronic component illustrated in FIG. 4A.
Figure 5D:
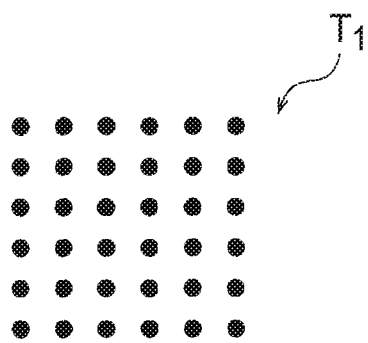
FIG. 5D illustrates an example of an image (first model image) for describing the method for detecting an attitude of the first electronic component illustrated in FIG. 4A.

Then, as illustrated in step S3 of FIG. 8A, an extraction process is performed as a pretreatment for a process of image matching with a model image. In the extraction process, X-Y coordinates x, y) of the barycentric position of an image of each ball terminal 13 illustrated in FIG. 5B are extracted. The barycentric position is extracted and obtained by calculating the center position of the ball terminal 13 from its circularity. Thus, the X-Y coordinates of each ball terminal 13 are obtained as illustrated in FIG. 5C (the point denoted by a "+" mark in the figure) and image matching will be performed between the coordinates of each ball terminals 13 and coordinates of a ball terminal of the prepared model image. As described above, what is illustrated in FIG. 4A is the first electronic component 11 and step S4 of FIG. 8A is therefore followed by step S5. FIG. 5D illustrates an example of a first model image T1. The first model image T1 illustrated in the figure is an image that includes all the ball terminals 13 of the first electronic component 11. In an alternative embodiment, such as when the electronic component has a characteristic arrangement pattern of ball terminals, the first model image T1 may be prepared for a part of the ball terminals that includes the characteristic arrangement pattern.

Figure 5E:
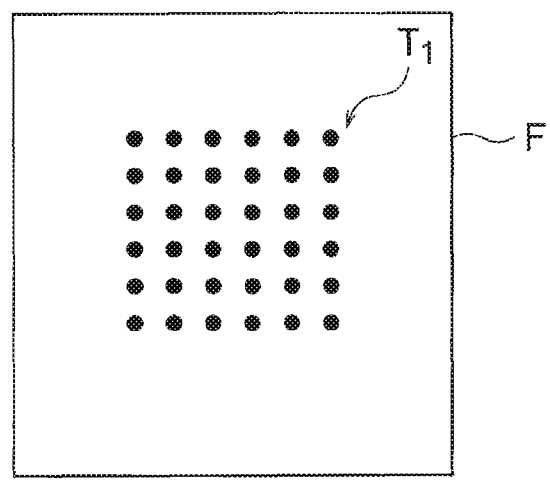
FIG. 5E illustrates an example of an image (image after image matching) for describing the method for detecting an attitude of the first electronic component illustrated in FIG. 4A.

Then, in step S5 of FIG. 8A, the image matching process is executed. The image matching process for the actual coordinates of each ball terminal 13 illustrated in FIG. 5C and the coordinates of each ball terminal 13 of the first model image T1 is performed by image matching between the first model image T1 (a set of positional coordinates (x, y) of ball terminals) and a set of positional coordinates (x, y) of ball terminals extracted from the actual image. More specifically, this process is performed through associating two points: each point of the first model image and each point extracted from the actual image with each other, obtaining a candidate that minimizes the RMS error (root-mean-square error) of all the points which can be associated, and employing the candidate as a candidate of image matching. When, in step S6 of FIG. 8A, a candidate of image matching is detected by the above-described image matching process, the routine proceeds to step S7. FIG. 5E is a view illustrating a candidate of image matching with the first model image T1. In this position $(x_1, y_1, \theta_1)$, the coordinate difference components $(\Delta x, \Delta y, \Delta \theta)$ with respect to the coordinates $(x_0, y_0, \theta_0)$ of the first model image represent the attitude of the first electronic component 11 to be obtained. If image matching with the first model image T1 cannot be successfully performed, such as due to erroneous imaging by the second camera 221 and erroneous image processing, the routine proceeds to step S8 of FIG. 8A, in which an error process is performed and the routine returns to step S1 or the error is reminded without performing any action.

As the above, detection of an attitude of the first electronic component 11 illustrated in FIG. 4A is performed using the second camera 221, and the adjustment unit 330 of the contact arm 300 is operated on the basis of the obtained coordinate difference components $(\Delta x, \Delta y; \Delta \theta)$ of the first electronic component 11 to perform relative alignment of the first electronic component 11 with respect to contact pins of the socket 410.

In general, when the above-described electronic component testing apparatus 1 is used to test DUTs 10, DUTs 10 of the same shape are tested in a manufacturing lot unit, but the same electronic component testing apparatus 1 may be used to test DUTs 10 of different shapes. In this case, if the size of the DUTs 10 is significantly different, each DUT 10 may not fully fall within the imaging range F, because the above-described second camera 221 is fixed to the imaging unit 220. FIG. 4B is a plan view illustrating this situation in which the second electronic component 12 does not fully fall within the imaging range F of the second camera 221 represented by the dotted frame.

In consideration of the reliability of a result of the above-described image matching process, it is preferred that the model image be the same as the whole image of the DUT 10. This is because, if a part of the DUT 10 is set as a model image, image matching may be hit at a plurality of sites. In this context, the second camera 221 may have to be moved to an appropriate position or replaced with another camera 221 having a large view angle so that the imaging range F of FIG. 4B is enlarged to allow the camera to capture the whole image of the second electronic component 12. In any case, the mechanical configuration has to be changed or added. To overcome this inconvenience, in the apparatus and method for detecting an attitude of the present invention, the software configuration for image processing is contrived to respond to the above.

This will be described in more detail. The imaging range F of the second camera 221 is set such that, even for a second electronic component 12 of which only a part can be imaged, a corner part C of the ball terminals 13 can be imaged, and a second model image T2 is set to include the corner part C of the ball terminals 13. After these settings, even when there is a plurality of candidates for which image matching is confirmed by the above-described image matching process, the most correct candidate is selected from among the plurality of candidates with reference to the corner part C of the ball terminals 13. This process will be described below.

Figure 9A:
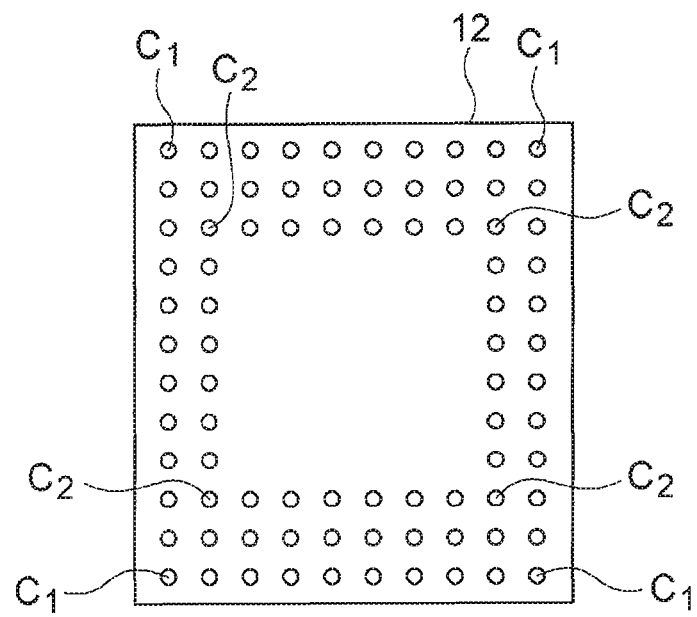
FIG. 9A is a plan view illustrating another example of the second electronic component which is an object to be detected by the apparatus and method for detecting an attitude of electronic components according to the present invention.
Figure 9B:
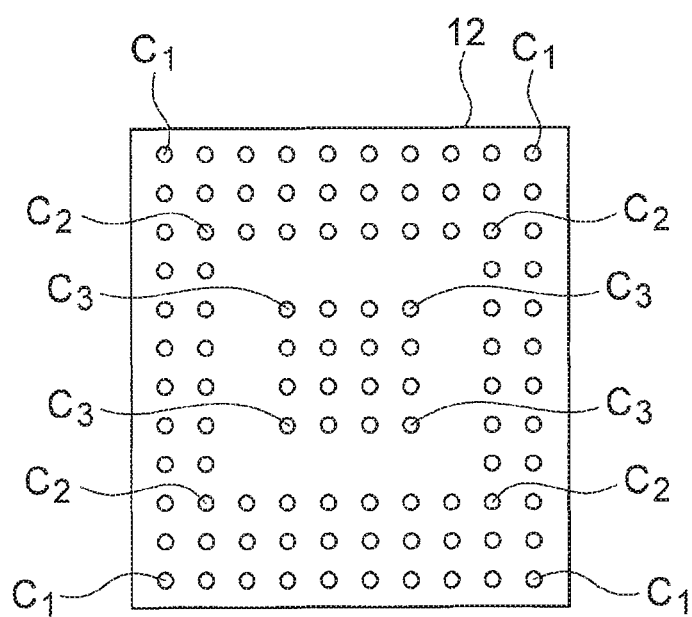
FIG. 9B is a plan view illustrating still another example of the second electronic component which is an object to be detected by the apparatus and method for detecting an attitude of electronic components according to the present invention.

One of preconditions in the present embodiment is that, when the fixing position and view angle of the second camera 221 are not changed, at least the corner part C of the ball terminals 13 of the second electronic component 12 illustrated in FIG. 4B falls within an imaging range F that is the same as the imaging range F (dotted frame) of the second camera 221 for the first electronic component 11 illustrated in FIG. 4A. In the case of the ball terminals 13 having a pattern as illustrated in FIG. 4B, it suffices that any one of four corner parts C falls within the imaging range F illustrated as the dotted frame in the figure. In the case of a BGA 12 with ball terminals 13 having a pattern as illustrated in FIG. 9A, it suffices that, in addition to four corner parts C1 at the outside, any one of four corner parts C2 at the inside falls within the imaging range F of the second camera 221. In the case of a BGA with ball terminals 13 having a pattern as illustrated in FIG. 9B, it suffices that, in addition to four corner parts C1 at the outside and four corner parts C2 at the inside, any one of four corner parts C3 located further inside falls within the imaging range F of the second camera 221.

Figure 6A:
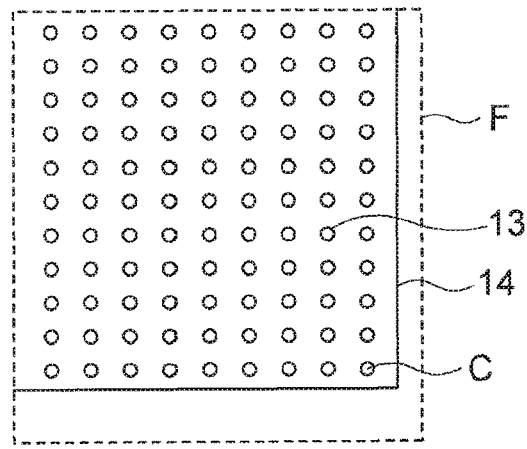
FIG. 6A illustrates an example of an image (captured raw image) for describing a method for detecting an attitude of the second electronic component illustrated in FIG. 4B.
Figure 6B:
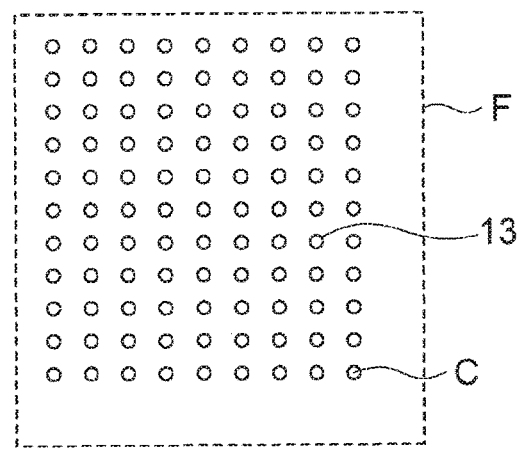
FIG. 6B illustrates an example of an image (image after a binarization process) for describing the method for detecting an attitude of the second electronic component illustrated in FIG. 4B.

Another one of preconditions in the present embodiment is that the second model image T2 includes as its part the above-described corner part C which falls within the imaging range F of the second camera 221. FIG. 6D illustrates an example of the second model image T2 of the second electronic component 12, which includes ball terminals 13 arranged in 4 rows by 8 columns, and this corresponds to ball terminals 13 arranged in 4 rows from the lower right to above and by 8 columns to the left in the imaging range F illustrated as the dotted frame in FIG. 4B.

Under such preconditions, as illustrated in step S1 of FIG. 8A, the second camera 221 is first used to image the second electronic component 12 suctioned by the holding unit 380 of the contact arm 300. FIG. 6A illustrates an example of an image captured by the second camera 221. As in the case of the above-described first electronic component 11, the raw image captured by the second camera 221 is, for example, a 256-gradation image. To extract only an image of the ball terminals 13 from the raw image which includes unnecessary parts, such as an outer shape 14 of the IC package and the lower surface of the holding unit 380 of the contact arm 300 which adsorbs and holds the DUT 10, as illustrated in step S2 of FIG. 8A, the raw image of FIG. 6A undergoes a black-and-white binarizing process and an area filtering process that extracts only an image corresponding to the ball terminals 13. Through this operation, as illustrated in FIG. 6B, a binarized image of the ball terminals 13 is obtained from which unnecessary images are removed, such as an outer shape 14 of the IC package and the lower surface of the holding unit 380 of the contact arm 300 which adsorbs and holds the DUT 10.

Then, as illustrated in step S3 of FIG. 8A, an extraction process is performed as a pretreatment for an image matching process. In the extraction process, X-Y coordinates (x, y) of the barycentric position of an image of each ball terminal 13 illustrated in FIG. 6B are extracted. The barycentric position is extracted and obtained by calculating the center position of the ball terminal 13 from its circularity. Thus, the X-Y coordinates of each ball terminal 13 are obtained as a point denoted by a "+" mark in FIG. 6C. As described above, what is illustrated in FIG. 4B is the second electronic component 12 and step S4 of FIG. 8A is therefore followed by step S11 of FIG. 8B, in which image matching will be performed with a prepared second model image T2 of the ball terminals 13 of the second electronic component 12.

FIG. 6D illustrates an example of the second model image T2 of the second electronic component 12.

Figure 8B:
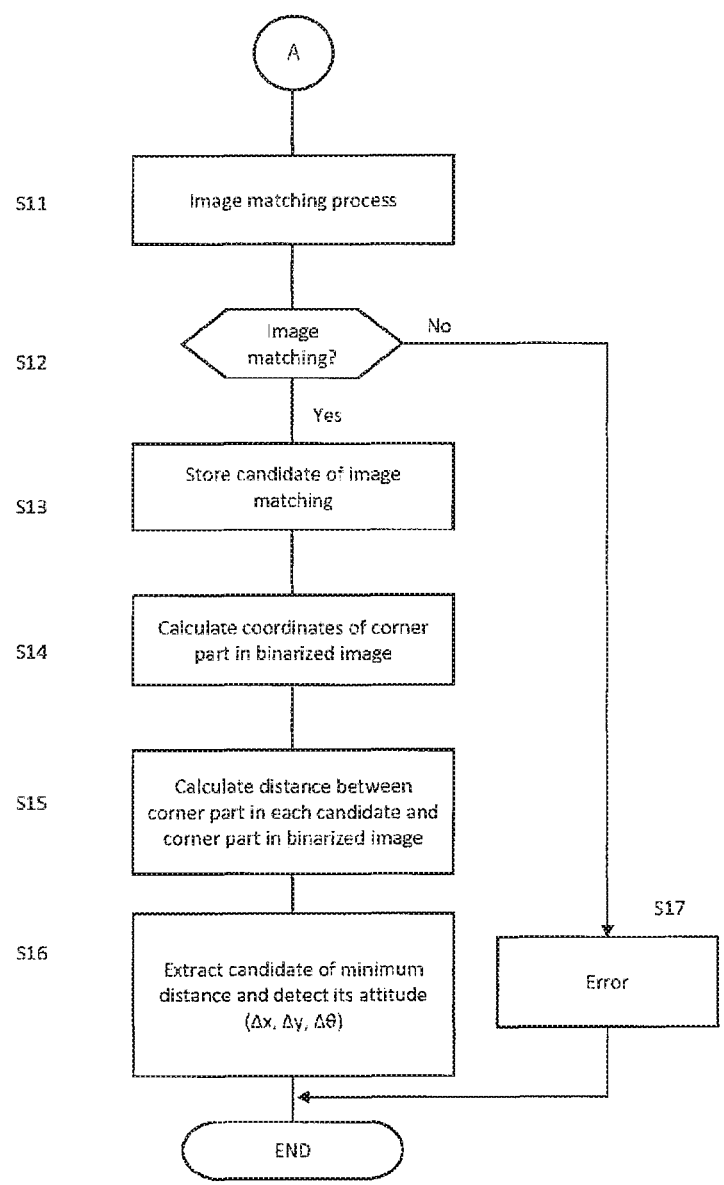
FIG. 8B is a flowchart (part 2) illustrating an example of the process of the apparatus and method for detecting an attitude according to the present invention.

Then, in step S11 of FIG. 8B, the image matching process is executed. The image matching process for the actual coordinates of each ball terminal 13 illustrated in FIG. 6C and the coordinates of each ball terminal 13 of the second model image T2 is performed, as in the case of the above-described first electronic component 11, by image matching between the second model image T2 (a set of positional coordinates (x, y) of ball terminals) and a set of positional coordinates (x, y) of ball terminals extracted from the actual image. Then, when one or more candidates of image matching by the above-described image matching process are detected in step S12 of FIG. 8B, the routine proceeds to step S13. FIG. 6E, FIG. 6F and FIG. 6G are each a view illustrating a candidate position of image matching with the second model image T2. As described above, when a part of the second electronic component 12 is set as the second model image T2, a plurality of candidate positions of image matching with the second model image T2 may be hit. Thus, FIG. 6E, FIG. 6F and FIG. 6G illustrate cases in which three such candidates exist. In any case, the image matching condition is satisfied in the image matching process, and in each candidate position $(x_1, y_1, \theta_1)$, $(x_2, y_2, \theta_2)$ or $(x_3, y_3, \theta_3)$, the coordinate difference components $(\Delta x_1, \Delta y_1, \Delta \theta_1)$ $(\Delta x_2, \Delta y_2, \Delta \theta_2)$ or $(\Delta x_3, \Delta y_3, \Delta \theta_3)$ with respect to the coordinates $(x_0, y_0, \theta_0)$ of the second model image T2 are obtained.

Figure 6C:
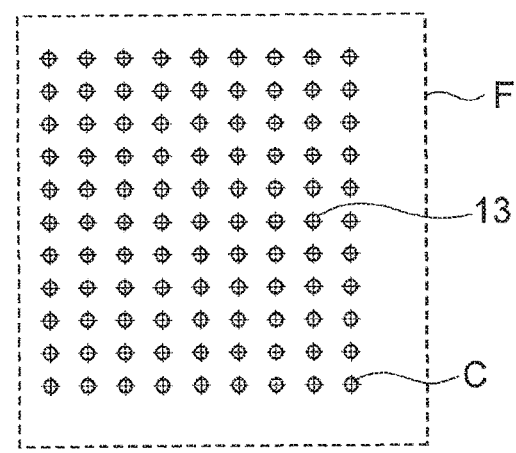
FIG. 6C illustrates an example of an image (image after a barycentric position process) for describing the method for detecting an attitude of the second electronic component illustrated in FIG. 4B.
Figure 6D:
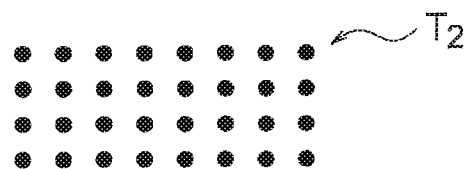
FIG. 6D illustrates an example of an image (second model image) for describing the method for detecting an attitude of the second electronic component illustrated in FIG. 4B.
Figure 6E:
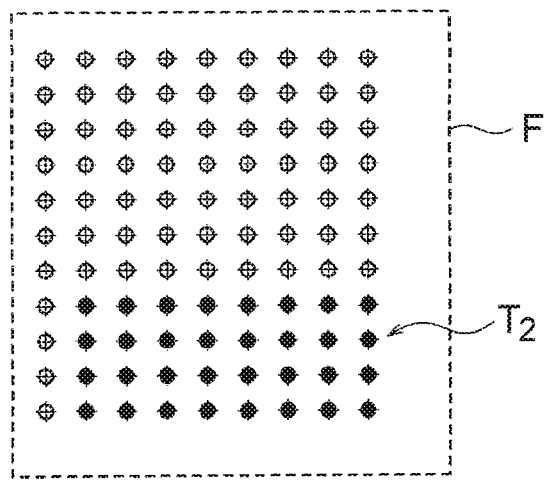
FIG. 6E illustrates an example of an image (image after image matching; part 1) for describing the method for detecting an attitude of the second electronic component illustrated in FIG. 4B.
Figure 6F:
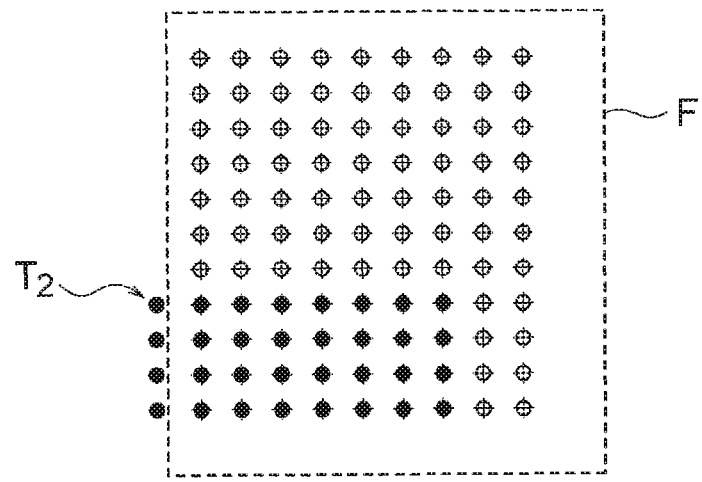
FIG. 6F illustrates an example of an image (image after image matching; part 2) for describing the method for detecting an attitude of the second electronic component illustrated in FIG. 4B.
Figure 6G:
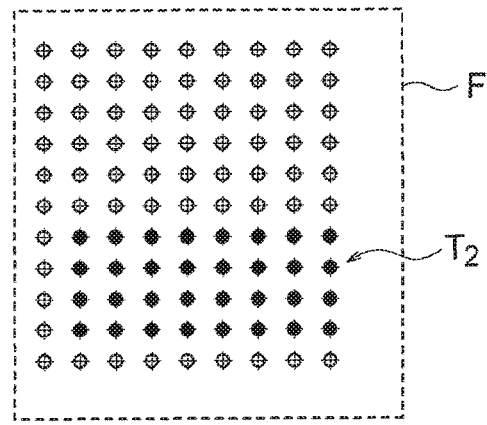
FIG. 6G illustrates an example of an image (image after image matching; part 3) for describing the method for detecting an attitude of the second electronic component illustrated in FIG. 4B.
Figure 7A:
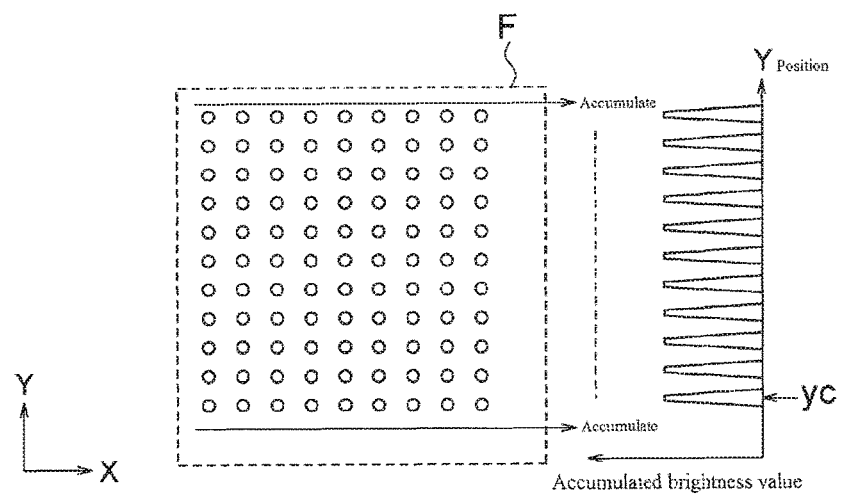
FIG. 7A is a view for describing the method for detecting an attitude of the second electronic component illustrated in FIG. 4B (a brightness accumulation process; part 1)
Figure 7B:
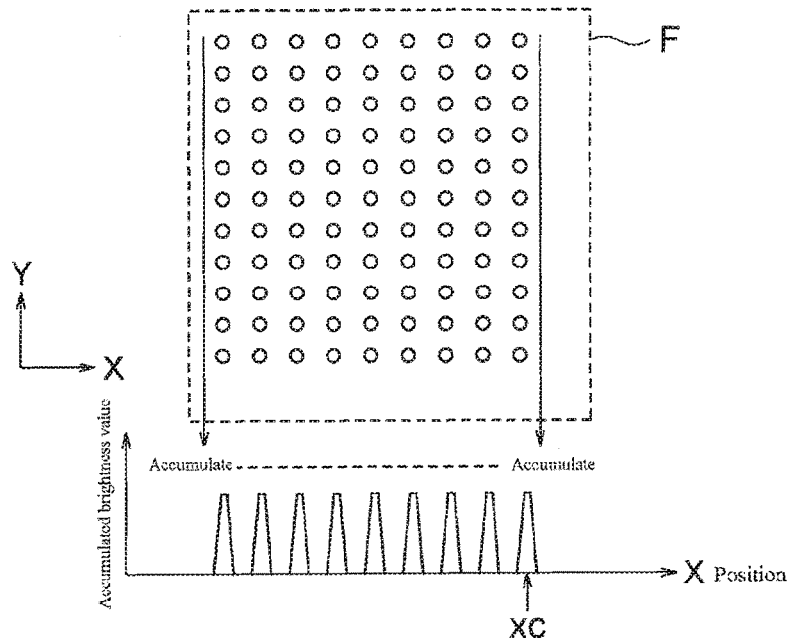
FIG. 7B is a view for describing the method for detecting an attitude of the second electronic component illustrated in FIG. 4B (the brightness accumulation process; part 2)
Figure 7C:
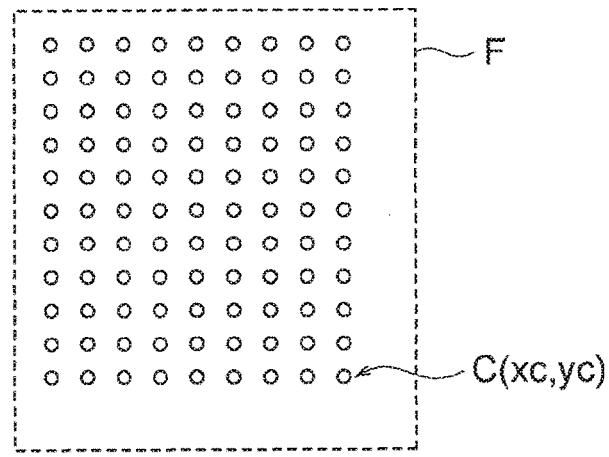
FIG. 7C is a view for describing the method for detecting an attitude of the second electronic component illustrated in FIG. 4B (calculation of a corner part)

Then, in step S14 of FIG. 8B, coordinates of the corner part C of the ball terminals 13 in the binarized image of FIG. 6C are calculated. FIG. 7A to FIG. 7C are each a view for describing a process of calculating the coordinates of the corner part C in the binarized image of FIG. 6C. This process is performed in step S14 of FIG. 8B. First, as illustrated in FIG. 7A, a brightness value of each pixel, for example, is accumulated while projecting the binarized image of FIG. 6C to the X-axis direction and this accumulation calculation is executed for all the pixels in the Y-axis direction. Through this operation, a brightness value profile is obtained as illustrated in the right-side graph of the figure, in which the ordinate axis represents the accumulated brightness value while the abscissa axis represents the position in the Y-axis direction. It is already known that the corner part C of the ball terminals 13 exists at the lower side in the imaging range of the second camera 221, and therefore the lowermost Y-coordinate $y_c$ in the Y-axis direction is the Y-coordinate of the corner part C. Similarly, as illustrated in FIG. 7B, a brightness value of each pixel, for example, is accumulated while projecting the binarized image of FIG. 6C to the Y-axis direction and this accumulation calculation is executed for all the pixels in the X-axis direction. Through this operation, a brightness value profile is obtained as illustrated in the lower-side graph of the figure, in which the ordinate axis represents the accumulated brightness value while the abscissa axis represents the position in the X-axis direction. It is already known that the corner part C of the ball terminals 13 exists at the right side in the imaging range of the second camera 221, and therefore the rightmost X-coordinate $x_c$ in the X-axis direction is the X-coordinate of the corner part C. Thus, as illustrated in FIG. 7C, the coordinates $(x_c, y_c)$ of the corner part C of the ball terminals 13 in the binarized image of FIG. 6C are obtained. When performing the process of extracting the corner part C of FIG. 7A to FIG. 7C, the relative rotation angle $\Delta\theta$ of the binarized image of FIG. 6B with respect to the second model image T2 is already known, so this process is performed on the coordinate system to which the relative rotation angle Δθ is added.

Then, in step S15 of FIG. 8B, the distance is calculated, such as using the Pythagorean theorem, between the coordinates of the corner part C in each of three candidate positions illustrated in FIG. 6E to FIG. 6G (the coordinates are recognized from the second model image T2) and the coordinates of the corner part C in the binarized image obtained in step S14. Then, in step S16 of FIG. 8B, a candidate position is extracted which has the smallest distance among the distances obtained in step S15 (the candidate position of FIG. 6E among three candidate positions of FIG. 6E to FIG. 6G). In this position $(x_1, y_1, \theta_1)$, the coordinate difference components $(\Delta x, \Delta y, \Delta\theta)$ with respect to the coordinates $(x_0, y_0, \theta_0)$ of the second model image T2 represent the attitude of the second electronic component 12 to be obtained. If, in step S12 of FIG. 8B, image matching with the second model image T2 cannot be successfully performed, such as due to erroneous imaging by the second camera 221 and erroneous image processing, the routine proceeds to step S17 of FIG. 8B, in which an error process is performed and the routine returns to step S1 or the error is reminded without performing any action.

As the above, detection of an attitude of the second electronic component 12 illustrated in FIG. 4B is performed using the second camera 221, and the adjustment unit 330 of the contact arm 300 is operated on the basis of the obtained coordinate difference components $(\Delta x, \Delta y, \Delta\theta)$ of the second electronic component 12 to perform relative alignment of the second electronic component 12 with respect to contact pins of the socket 410.

As described above, according to the apparatus and method for detecting an attitude of electronic components of the present embodiment, the attitude of the DUT 10 can be accurately recognized even when only a part of the electronic component can be imaged. Moreover, the general versatility of the electronic component testing apparatus 1 can be enhanced because each attitude of the first electronic component 11 of a small size illustrated in FIG. 4A and the second electronic component 12 of a large size illustrated in FIG. 4B can be accurately recognized without changing the fixing position and view angle of the second camera 221.

DESCRIPTION OF REFERENCE NUMERALS

1 Electronic component testing apparatus
10 Electronic component
11 First electronic component
12 Second electronic component
13 Ball terminal
14 Outer shape of package
F Imaging range by second camera
T1 First model image
T2 Second model image
100 Handler
101 Base plate
102 Controller
110 First transport device
120 Second transport device
122 First movable head
123 Second movable head
124 Z-direction actuator
125 First camera
130 Third transport device
140 First X-direction buffer
150 Second X-direction buffer
160 First Y-direction buffer
170 Second Y-direction buffer
180 Heat plate
200 Alignment device
210 Moving unit
211 X-direction rail
212 Slide portion
220 Imaging unit
221 Second camera
222 Mirror
223 Air cylinder
230 Operation unit
300 Contact arm
310 Base part
311 Housing
330 Adjustment unit
380 Holding unit
400 Test head
410 Socket
500 Tester
20A, 20B Customer tray

What is claimed is:

1. An electronic component testing method for detecting an attitude of electronic components, positioning the electronic components with respect to a socket on the basis of the attitude of the electronic components, and bringing the electronic components into electrical contact with the socket to test the electronic components, the electronic components including a first electronic component and a second electronic component each configured such that a plurality of terminals is regularly arranged in an X-Y plane, the method comprising:

(a) preparing an imaging device fixed to a site at which the imaging device can image a whole of the plurality of terminals of the first electronic component but can image only a part of the plurality of terminals of the second electronic component, the part including a corner part of the plurality of terminals of the second electronic component;

(b) storing at least a first model image of a part or whole of the plurality of terminals of the first electronic component and a second model image of the part, including the corner part, of the plurality of terminals of the second electronic component;

(c) extracting a binarized image of the plurality of terminals of the second electronic component from an image acquired by the imaging device;

(d) performing image matching between each terminal in the binarized image of the second electronic component and each terminal in the second model image and extracting attitude candidates of image matching;

(e) extracting a coordinate of an endmost part of the plurality of terminals in the X-axis direction and a coordinate of an endmost part of the plurality of terminals in the Y-axis direction from the binarized image of the second electronic component and obtaining coordinates of the corner part of the plurality of terminals in the binarized image from the coordinate of the endmost part in the X-axis direction and the coordinate of the endmost part in the Y-axis direction; and (f) selecting an attitude candidate from among the attitude candidates and outputting the attitude candidate as a detected attitude of the second electronic component, the attitude candidate being selected such that the coordinates of the corner part in the second model image in the attitude candidate are closest on the X-Y plane to the coordinates of the corner part of the plurality of terminals in the binarized image, wherein, for the binarized image of the second electronic component, the (e) includes executing, across the Y-axis direction, a process of accumulating brightness values of the binarized image in the X-axis direction to extract a Y coordinate at which a peak of an accumulated brightness value is located at the endmost part, and executing, across the X-axis direction, a process of accumulating brightness values of the binarized image in the Y-axis direction to extract an X coordinate at which a peak of an accumulated brightness value is located at the endmost part.

2. The electronic component testing method according to claim 1, wherein the first electronic component and the second electronic component are each a ball grid array type IC chip and the terminals are ball terminals.

\* \* \* \* \*